United States Patent
Massetti (10) Patent No.: US 8,946,848 B2
(45) Date of Patent: Feb. 3, 2015

(54) APPARATUS AND METHOD FOR IMAGE SENSOR WITH CARBON NANOTUBE BASED TRANSPARENT CONDUCTIVE COATING

(75) Inventor: Dominic Massetti, San Jose, CA (US)

(73) Assignee: OmniVision Technologies, Inc., Santa Clara, CA (US)

(*) Notice: Subject to any disclaimer, the term of this patent is extended or adjusted under 35 U.S.C. 154(b) by 1990 days.

(21) Appl. No.: 12/133,780

(22) Filed: Jun. 5, 2008

(65) Prior Publication Data

US 2009/0302411 A1 Dec. 10, 2009

(51) Int. Cl.
| | |
|---|---|
| *H01L 21/00* | (2006.01) |
| *H01L 27/146* | (2006.01) |
| *B82Y 10/00* | (2011.01) |
| *B82Y 20/00* | (2011.01) |
| *H01L 31/0216* | (2014.01) |

(52) U.S. Cl.
CPC ........... *H01L 27/14609* (2013.01); *B82Y 10/00* (2013.01); *B82Y 20/00* (2013.01); *H01L 27/14621* (2013.01); *H01L 27/14685* (2013.01); *H01L 31/02162* (2013.01)
USPC .......................................... 257/447

(58) Field of Classification Search
USPC .......................................... 257/447, E27.016
See application file for complete search history.

(56) References Cited

U.S. PATENT DOCUMENTS

| | | | |
|---|---|---|---|
| 6,169,319 B1 | 1/2001 | Malinovich et al. | |
| 7,265,174 B2 | 9/2007 | Carroll et al. | |
| 7,273,661 B2 | 9/2007 | Moriyama et al. | |
| 7,355,228 B2 | 4/2008 | Rhodes | |
| 2005/0199894 A1* | 9/2005 | Rinzler et al. | 257/94 |
| 2006/0057290 A1 | 3/2006 | Glatkowski | |
| 2007/0072325 A1 | 3/2007 | Rhodes | |
| 2008/0070340 A1 | 3/2008 | Borrelli et al. | |
| 2008/0088219 A1 | 4/2008 | Yoon et al. | |
| 2010/0136224 A1* | 6/2010 | Britz et al. | 427/122 |

OTHER PUBLICATIONS

Hui-min Sun et al., "Preparation and Absorption Properties in Near Infrared Wavelength of Carbon Nanotubes/Acrylate Coatings," *Chinese Journal of Chemical Physics*, Abstract, 2 pages.
Charles Q. Choi "Unidym—CNI Merger is Bellwether for Nanotech Business, White paper from Eikos," Mar. 22, 2007, 2 pages.
Paul J. Glatkowski, "Carbon Nanotube Based Transparent Conductive Coatings," White paper from Eikos, 7 pages.

* cited by examiner

*Primary Examiner* — Tucker Wright
(74) *Attorney, Agent, or Firm* — Lathrop & Gage LLP (57) ABSTRACT

A backside illuminated image sensor has a carbon nanotube transparent conductive coating formed on the backside of the image sensor. In one implementation the carbon nanotube transparent conductive coating acts as a wavelength selective filter to filter out infrared light. In one implementation the carbon nanotube transparent conductive coating has an optical transparency between 50% and 80% for blue and green color bands.

19 Claims, 7 Drawing Sheets

APPARATUS AND METHOD FOR IMAGE SENSOR WITH CARBON NANOTUBE BASED TRANSPARENT CONDUCTIVE COATING

FIELD OF THE INVENTION

The present invention is generally related to techniques to provide a transparent conductive coating on the backside of a backside illuminated image sensor. More particularly, the present invention is directed to a backside illuminated image sensor having a carbon nanotube transparent conductive coating.

BACKGROUND OF THE INVENTION

Image sensors are typically formed on a semiconductor substrate. For example, Complementary Metal Oxide Semiconductor (CMOS) image sensors are typically formed on a silicon substrate. CMOS processes to fabricate photo-sensitive pixels comprising photodiodes are well known in the art and described in various patents by OmniVision Technologies, such as U.S. Pat. No. 7,355,228 and U.S. Pat. Pub. 20070072325, the contents of which are hereby incorporated by reference.

In a Front-side Illuminated (FSI) arrangement the front-side of the image sensor receives the input light after the light passes through other front-side portions, such as a micro-lens, color-filter array, infrared filter, and metal interconnect regions. The micro-lens focuses light into each pixel. The color-filter array filters a specific color of light into each pixel. CMOS-based image sensors are typically sensitive to infrared radiation. As a result, certain wavelengths of infrared light have the potential to degrade sensor detection of visible light. Consequently, an infrared filter is typically used in CMOS image sensors designed to detect visible light.

However, a disadvantage of a FSI image sensor is that it is difficult to achieve a high fill factor, where the fill factor is the percentage of the pixel area sensitive to light. In particular, the metal and polysilicon lines of the interconnection regions of the CMOS circuitry can block some of the light from reaching individual photodiodes, reducing the fill factor.

Figure 1:
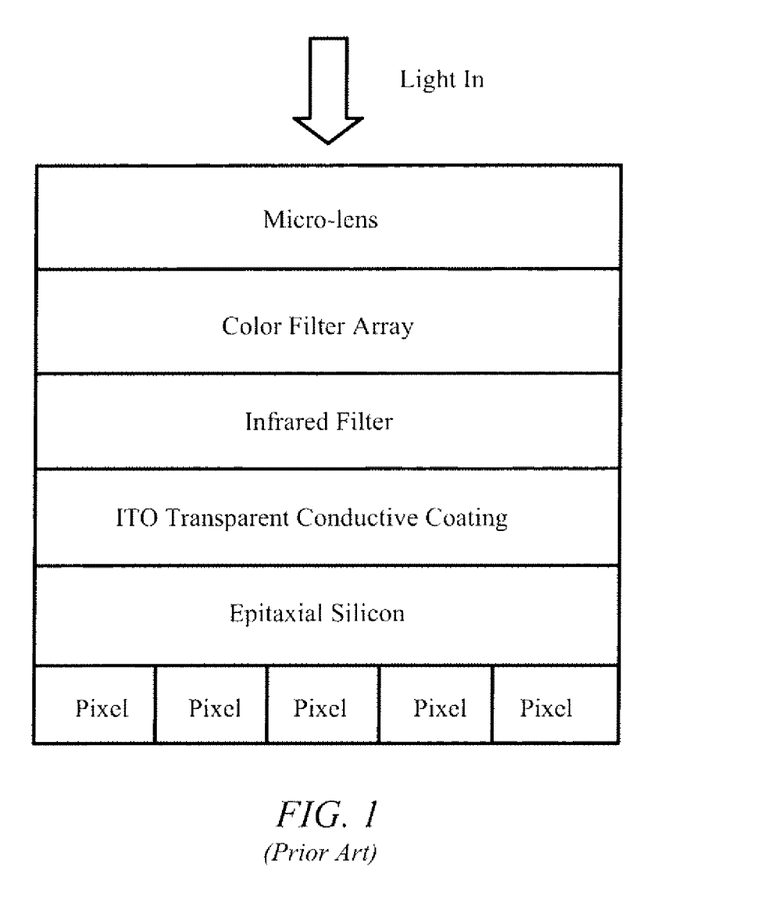
FIG. 1 illustrates a Back Side Illuminated (BSI) image sensor in accordance with the prior art.

Referring to FIG. 1, in a Back Side Illuminated (BSI) image sensor the image sensor receives light through a backside of the substrate supporting the image sensor. The fill factor of a BSI image sensor can be high and in some cases approach 100%. However, a BSI image sensor typically requires that the substrate be thinned to reduce optical absorption. For example, in some cases the substrate is thinned down to a silicon thickness of less than ten microns after front-side processing of the image sensor is completed.

A BSI image sensor typically has the backside coated with a transparent conductive coating (TCC) formed from Tin doped Indium Oxides (ITO). The transparent ITO coating is used to establish a uniform voltage bias to the substrate portion of each individual photodiode of the pixel array. A voltage bias provides several benefits, such as improved quantum efficiency and signal-to-noise ratio for some sensor configurations. ITO is a conductive oxide typically formed by vacuum sputtering and annealing. ITO has a high transparency to the visible spectrum and a low resistivity. An infrared filter is formed over the ITO layer, followed by a color filter array and a micro-lens.

Figure 2:
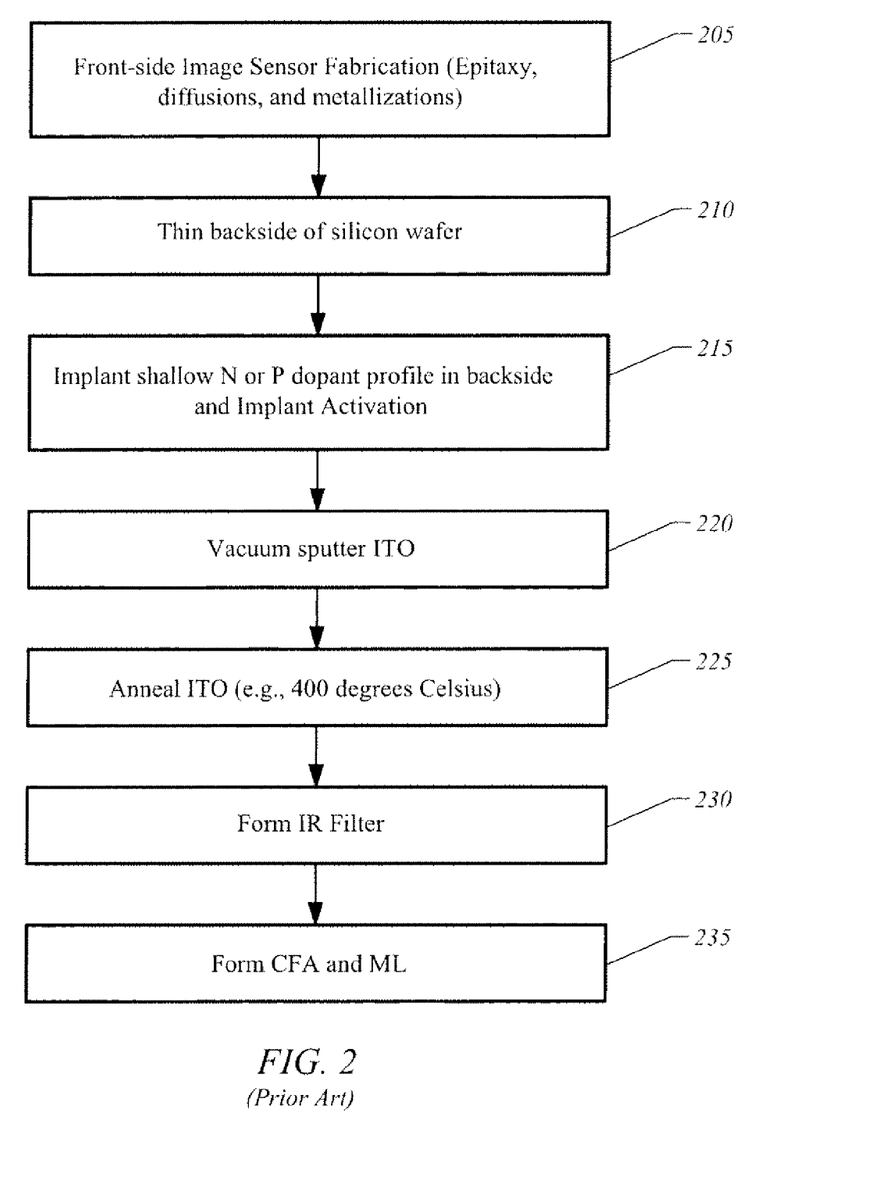
FIG. 2 illustrates a process sequence for a BSI image sensor having a Tin doped Indium Oxides (ITO) transparent conductive coating in accordance with the prior art.

However, an ITO TCC also has several undesirable characteristics. Referring to FIG. 2, a typical BSI image sensor fabrication process includes a front-side image sensor fabrication step 205, including epitaxy, diffusions, and metallization to form a pixel array. The backside of the silicon wafer is thinned in step 210. A shallow layer of N or P type dopants are implanted and activated in the backside in step 215. The ITO film is vacuum sputtered on the backside in step 220. The ITO film requires a moderate temperature anneal, as illustrated in step 225. An infrared filter is formed in step 230. The color filter array (CFA) and micro-lens (ML) are formed in step 235. Note that ITO TCCs require the thinned image sensor wafer to go through a thermal cycle at moderate temperatures. The thermal cycle required for the annealing step 225 is high enough (e.g., 400 degrees Celsius in some cases) that degradation of the image sensor is a potential concern. This degradation concern arises both because of the mechanical fragility of the thinned substrate and because the annealing temperatures are high enough to potentially affect front-side features. Moreover, ITO films used in image sensors are comparatively rigid and inflexible, which may stress the thinned substrate. Additionally, the cost of forming transparent conductive coatings using ITO has increased dramatically in recent years.

Therefore, in light of the above-described problems with ITO in BSI image sensors, the apparatus and method of the present invention was developed.

SUMMARY OF THE INVENTION

A backside illuminated image sensor includes a carbon nanotube transparent conductive coating formed on the backside of the image sensor using a low temperature process. The image sensor is designed to detect visible light. The carbon nanotube transparent conductive coating has characteristics selected so that the coating is at least semi-transparent to each wavelength of visible light that the image sensor is designed to detect. In one embodiment the carbon nanotube conductive coating has characteristics further selected so that the coating also acts as a wavelength selective optical filter to filter wavelengths of light that degrade performance of the image sensor, such as infrared light. The carbon nanotube transparent conductive coating may also have characteristics selected so that the carbon nanotube transparent conductive coating is flexible.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 3:
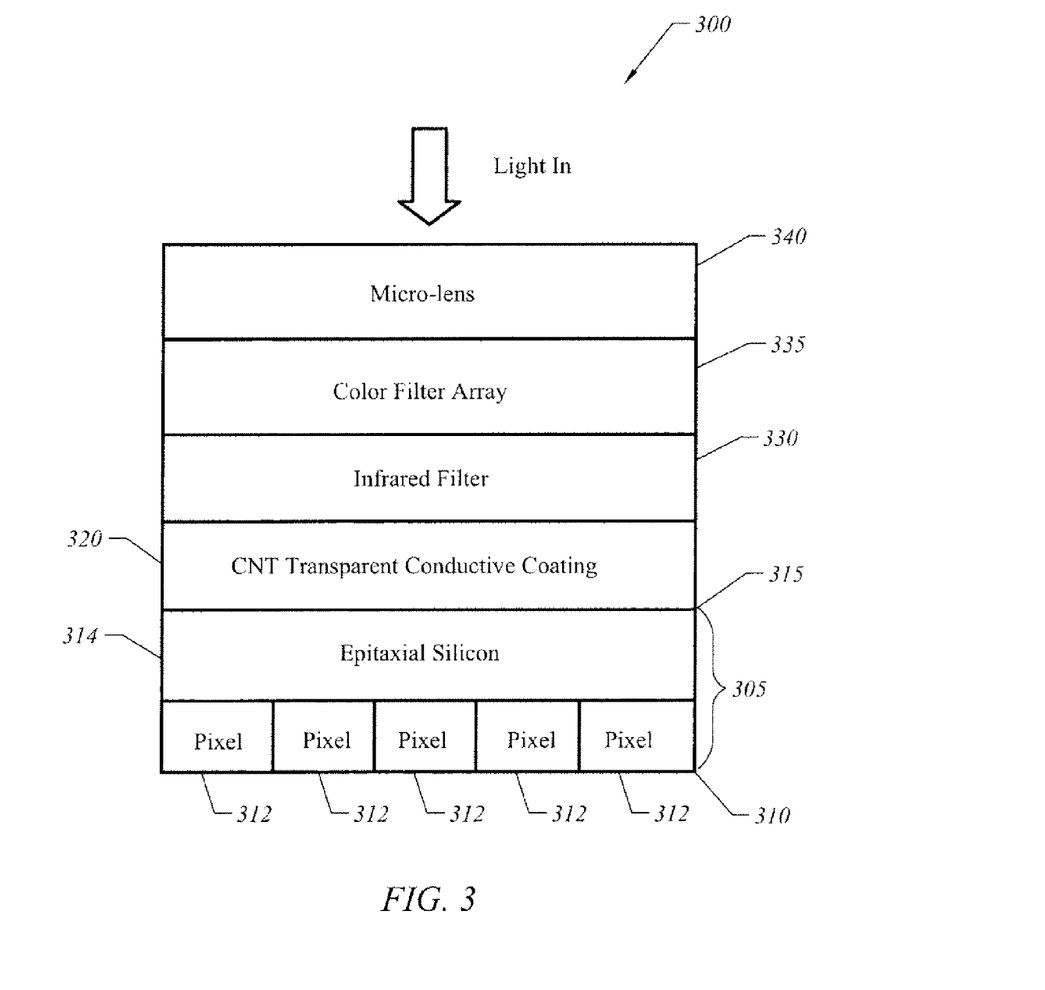
FIG. 3 illustrates a BSI image sensor having a carbon nanotube transparent conductive coating in accordance with one embodiment of the present invention.

FIG. 3 illustrates a Back Side Illuminated (BSI) image sensor 300 in accordance with one embodiment of the present invention. In one embodiment BSI image sensor 300 is a CMOS image sensor formed on epitaxial silicon. A semiconductor substrate 305 has a front surface 310 and a back surface 315 (hereinafter "backside 315"). An array of photosensitive pixels 312 is formed in substrate 305. The substrate 305 is thinned such that a comparatively small thickness of epitaxial silicon 314 remains below pixels 312. For example, a conventional fabrication process may be used to perform front-side processing on a conventional silicon wafer, such as growing an epitaxial layer on a silicon wafer, performing masked diffusion processes to define n-doped and p-doped pixel regions of photodiodes and other pixel elements, and forming electrical contacts and electrical interconnections to the front-side. After front-side processing is completed the semiconductor wafer is thinned down (e.g., thinned down until epitaxially grown layers of a bulk substrate are reached). An exemplary thickness of substrate 305 after the backside is thinned is ten microns or less.

A carbon nanotube (CNT) transparent conductive coating (TCC) 320 is formed on the backside 315 of the substrate 305 to apply a uniform bias to a substrate portion of each pixel 312. An infrared filter 330, color filter array 335, and microlens 340 are fabricated on top of CNT TCC 320. The infrared filter 330 filters out infrared light that would deleteriously affect the performance of image sensor 300. Color filter array 335 has an array of color filters with different colors. Color filter array 335 filters the visible light reaching a particular pixel to one specified color, such as red, green, or blue light such that individual pixels detect light at only one specified color. The micro-lens 340 serves to focus light into individual pixels.

CNTs are electrically conductive particles embedded in a host material (often called a "carrier" or "carrier media"). A loading level is commonly defined as the percentage, by weight, of CNTs. A minimum loading level is required to have appreciable conductance. Increasing the loading level above the minimum levels reduces sheet resistance. However, high loading levels change the mechanical properties of the CNT TCC 320 and also tend to reduce transparency. An exemplary carrier media for the CNT TCC 320 is a polyimide. As one example, the carrier may be a colorless polyimide such as polyimides based on triphenyl phosphine oxide derivatives. An exemplary loading level of the CNT is in the range of 10% to 50% depending on resistivity requirements. Exemplary carbon nanotube diameters are in the range of one to fifty nanometers. An exemplary film thickness of the CNT TCC is less than ten microns. An exemplary electrical resistivity of the CNT TCC is less than 200 Ohms/square. There are also different types of CNTs such as single walled CNTs, double walled CNTs, and multi-walled CNTs. The optical absorption spectra of the CNTs will depend on the characteristics of the CNTs. The electrical and optical properties of CNT TCC 320 will thus depend on its thickness, the loading level, CNT diameter, CNT type(s), and whether the carrier is optically transparent or includes other impurities.

The optical characteristics of CNT TCC 320 require careful consideration and have unique aspects not found in CNTs used in other types of opto-electronic devices, such as solar cells. An optical image sensor is typically designed to detect visible light about several different wavelength bands of visible light, such as detection of red, green, and blue (RGB) colored light. Consequently, the optical characteristics of CNT TCC 320 at each detected wavelength band need to be considered. The spectral response of a CMOS image sensor (without an IR filter and a color filter array) is wavelength dependent and extends into the near infrared. Image sensors have various figures of merit at each detected visible wavelength band, as described in chapter 3 of the book, *Image Sensors and Signal Processing for Digital Still Cameras*, pp. 53-94, Ed. Junichi Nakamura, CRC Press (2006), the contents of which are hereby incorporated by reference. The spectral response of an image sensor is often described by a spectral quantum efficiency and spectral responsivity. The quantum efficiency (at a specific wavelength) depends on the product of the transmittance of light above a detector, an effective fill factor, and a charge collection efficiency. The signal-to-noise ratio depends on the quantum efficiency. The responsivity is defined as the ratio of the photocurrent to the optical input power and is proportional to the quantum efficiency multiplied by the wavelength. Consequently, the responsivity is typically higher for longer visible wavelengths and peaks in the near infrared.

The transparency of CNT TCC 320 at each detected visible wavelength band is an important design consideration because it will affect the spectral response of image sensor 300. In designing image sensor 300, a required spectral response at each detected visible wavelength is defined, either explicitly or implicitly by virtue of figures of merit such as the signal-to-noise ratio. The optical absorption characteristics and transparency of CNT TCC 320 needs to be consistent with the required spectral response. Additionally, the sheet resistance of CNT TCC 320 determines the uniformity of the bias applied to each photodiode, which also affects sensor performance.

One possibility is to design CNT TCC 320 to have the highest achievable transparency for all detected wavelengths of light at a selected sheet resistance. However, note that various tradeoffs can be made in regards to the cost of CNT TCC 320, sheet resistance, and other figures of merit affected by the transparency (such as quantum efficiency) at each detected wavelength of interest. In optical image sensor applications the CNT TCC 320 preferably has an optical transparency of at least 50% for the shorter visible wavelengths of interest, such as green light and blue light. A very high optical transparency (e.g., 99%) may require a higher cost CNT TCC fabrication process. As one example, the material properties of CNT TCC 320 may be selected to achieve an optical transparency in the range of 50% to 99% with the selection being based on balancing different considerations, including fabrication cost and other figures of merit for the image sensor. By way of contrast a conventional ITO TCC has an optical transparency of about 80% for green light. Consequently, in one embodiment the transparency of CNT TCC 320 is selected to be at least 80% for green and blue light to match the transparency of a conventional ITO TCC.

The CNT TCC 320 may be used as a direct replacement for a conventional ITO TCC in a BSI image sensor. However, the CNT TCC 320 provides several advantages over a conventional ITO TCC. In an exemplary fabrication process the CNTs are dispersed in a carrier, such as a polyimide, deposited onto the backside of the substrate, and baked to drive off solvents. The process for fabricating the CNT TCC 320 is thus a comparatively low temperature solvent bake process (e.g., less than 200 degrees Celsius, with 120 degrees Celsius being an exemplary process temperature to drive out solvents). In contrast, a conventional ITO TCC process typically requires an annealing temperature of about 400 degrees Celsius, which has the potential to degrade a CMOS image sensor. Consequently, a BSI CMOS image sensor 300 using a CNT TCC 320 fabricated by a low temperature process provides an advance over the prior art.

Figure 4:
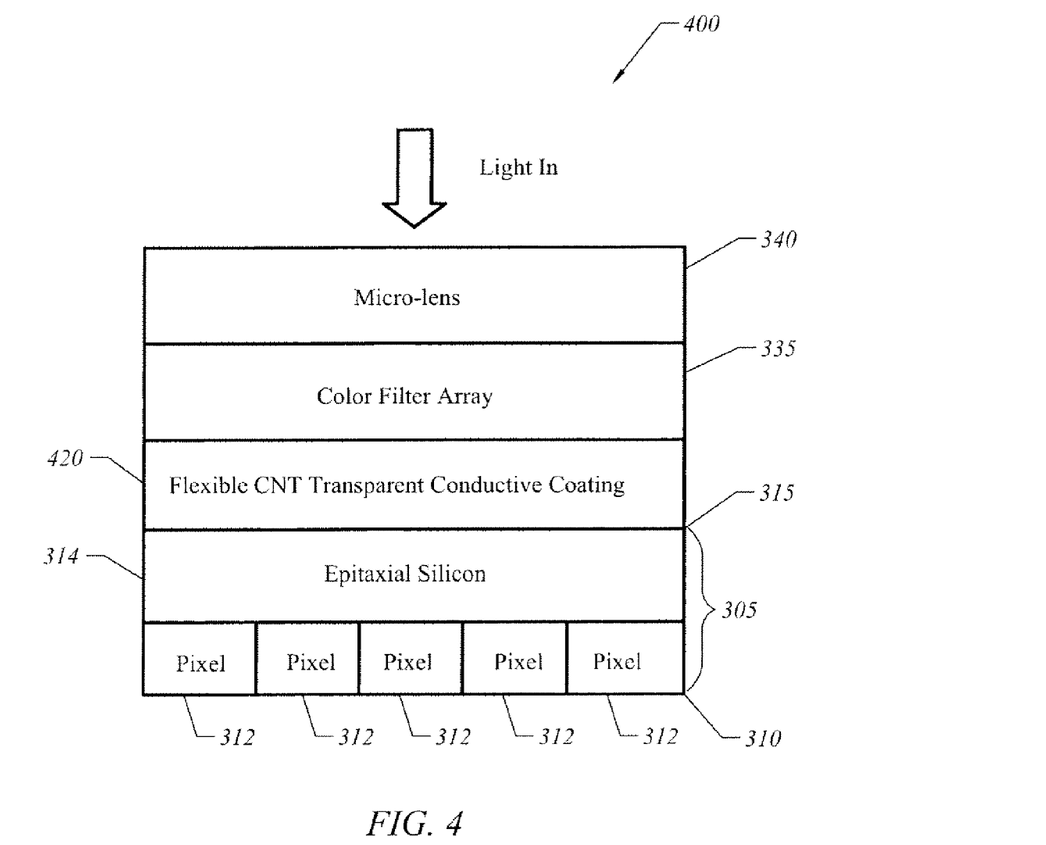
FIG. 4 illustrates a BSI image sensor having a flexible carbon nanotube conductive coating in accordance with one embodiment of the present invention.

Referring to FIG. 4, in one embodiment a CMOS image sensor 400 has a CNT TCC 420 that is flexible. Image sensor 400 is similar to image sensor 300 except that CNT TCC 420 has material characteristics selected such that it is flexible. A flexible CNT TCC 420 improves reliability. The carrier media of the CNT TCC 420 is a material that is flexible, such as a polyimide. Polyimide films have properties that permit them to be mechanically strong and also flexible, particularly if a low temperature process (e.g., less than 200 degrees Celsius, such as 120 degrees Celsius) is used to drive off solvents from the polyimide. However, the loading level of CNTs will also affect the material properties of CNT TCC 420. In particular, very high loading levels, such as a loading level of 50%, can increase the brittleness of a CNT coating. Additionally, the flexibility of CNT TCC 420 will also depend on its thickness. CNT TCC 420 is made flexible by selecting the CNT loading level, coating thickness, and carrier media characteristics (e.g., polyimide type and drying temperature/time). In contrast, ITO TCCs are comparatively stiff and inflexible as a result of the material properties of ITO and because an ITO TCC requires a comparatively thick coating to achieve a given electrical sheet resistance. In contrast, the inventor of the present application has recognized that a CNT TCC 420 has improved electrical conductance that permits the CNT TCC 420 to have a reduced thickness (for given sheet resistance) compared with ITO. Additionally, the CNT carrier may be chosen to be a flexible carrier medium. In particular, in one embodiment the thickness of the CNT TCC 420 is selected to be less than ten microns. As a result the CNT TCC 420 has improved flexibility over ITO TCC, which improves reliability.

Additionally, a flexible CNT TCC 420 facilitates a flexible image sensor configuration. Flexible image sensors require a support substrate that is flexible but also provides sufficient mechanical strength to support the semiconductor portions of the circuit. One approach to achieving a flexible image sensor is to flip chip mount the front side of CMOS image sensor 400 to a flexible support substrate (not shown). For example, a polyimide film may serve as the flexible support substrate. For example, polyimide films having a thickness in the range of 40 to 100 microns have been demonstrated as being suitable to form a flexible support substrate and may be patterned as an interposer to route electrical connections. However, other flexible support substrates may also be used. Consequently, in one embodiment image sensor 400 is flip-chip mounted to a flexible substrate and CNT TCC 420 is also flexible. However, it will also be understood that other known flexible image sensor configurations are contemplated. For example, it will also be understood that a CNT TCC 420 may have a thickness and material properties selected such that it provides at least part of the mechanical strength required to support the CMOS image sensor. Additionally, in an alternate embodiment a flexible CNT TCC 420 may also be utilized in a front side illuminated configuration. In a front side illuminated configuration, CNT TCC 420 may be formed on the front side and patterned to form separate electrical connections to individual pixels or to apply a uniform bias voltage to each pixel. It will also be understood that flexible CNT TCC 420 may be used with other types of image sensors besides CMOS image sensors formed on epitaxial silicon. In particular, there is currently ongoing research in the field in growing amorphous silicon detectors on flexible substrates. Additionally, there is industrial research in using organic semiconductor materials to form flexible detectors.

Figure 5:
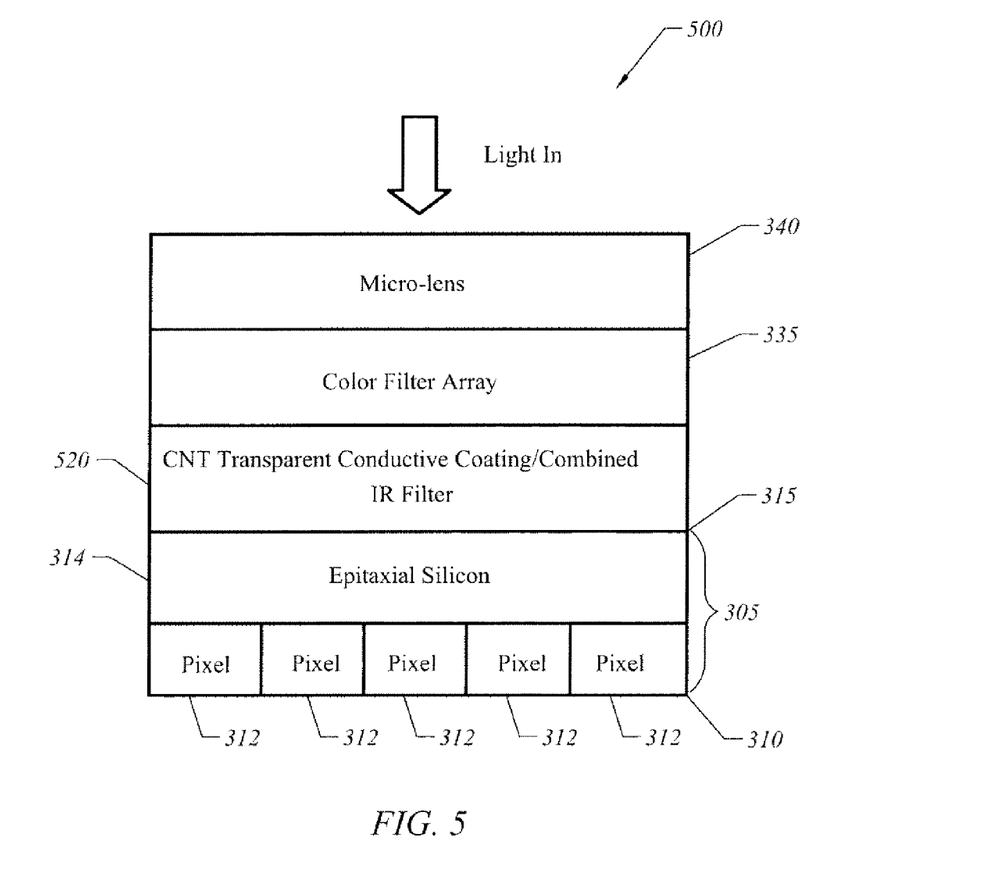
FIG. 5 illustrates a BSI image sensor having a carbon nanotube conductive coating acting as an optical filter for a deleterious wavelength band in accordance with one embodiment of the present invention.

Referring to FIG. 5, in one embodiment a CMOS image sensor 500 has a CNT TCC 520 that has optical characteristics tuned so that CNT TCC 520 also acts as an optical filter for a deleterious optical wavelength band. Image sensor 500 is similar to image sensor 300 except that the optical characteristics of CNT TCC 520 reduce the optical filtering requirements. In particular, the optical characteristics of CNT TCC 520 are tuned by selecting the distribution of CNT diameters, selecting CNT type (single wall carbon nanotubes, double walled carbon nanotubes, or multi-walled carbon nanotubes), a CNT loading level (percentage of CNTs in the carrier), and coating thickness. In particular, the CNT diameter and CNT type affect the optical absorption spectra of a CNT film. Additionally, the purity of the CNT is also another factor that affects the optical filtering characteristics of CNT TCC 520. The impurities may be unintentional impurities that arise naturally by virtue of using a low cost CNT fabrication process. Alternatively, impurities may be intentionally introduced in the polyimide to increase optical losses at selected wavelength bands. Another option would be to vary the chemical composition of the polyimide to increase optical losses at selected wavebands, such as infrared wavebands. If desired, CNT TCC 520 may also be formed using two or more CNT layers, with each layer having different CNT characteristics and/or impurities.

In one embodiment the CNT TCC 520 has its optical characteristics selected such that the CNT TCC 520 also serves as an optical filter for infrared radiation. For example, in one implementation the optical characteristics of the CNT TCC are chosen to filter light at wavelengths in the near infrared, thereby eliminating the need for a separate infrared filter. The human eye is sensitive to visible light between about 380 to 750 nanometers with red light having a wavelength in the range of 620 to 750 nanometers. However, the spectral response of silicon has a peak at about 750 nm but extends out in the near infrared to about 1,100 nanometers as described on page 79 of *Image Sensors and Signal Processing for Digital Still Cameras*. It is therefore desirable to filter out wavelengths in the near infrared that are within the spectral response of the image sensor. It will also be understood that it is contemplated that in one implementation CNT TCC 520 has optical characteristics selected to serve as a partial filter for a deleterious optical wavelength band to reduce the amount of filtering required by a separate optical filter. While near infrared radiation is one example of a deleterious optical wavelength band, it will be understood that in custom applications there may be other deleterious optical wavelength bands that require filtering in order to optimize image sensor performance.

Figure 6:
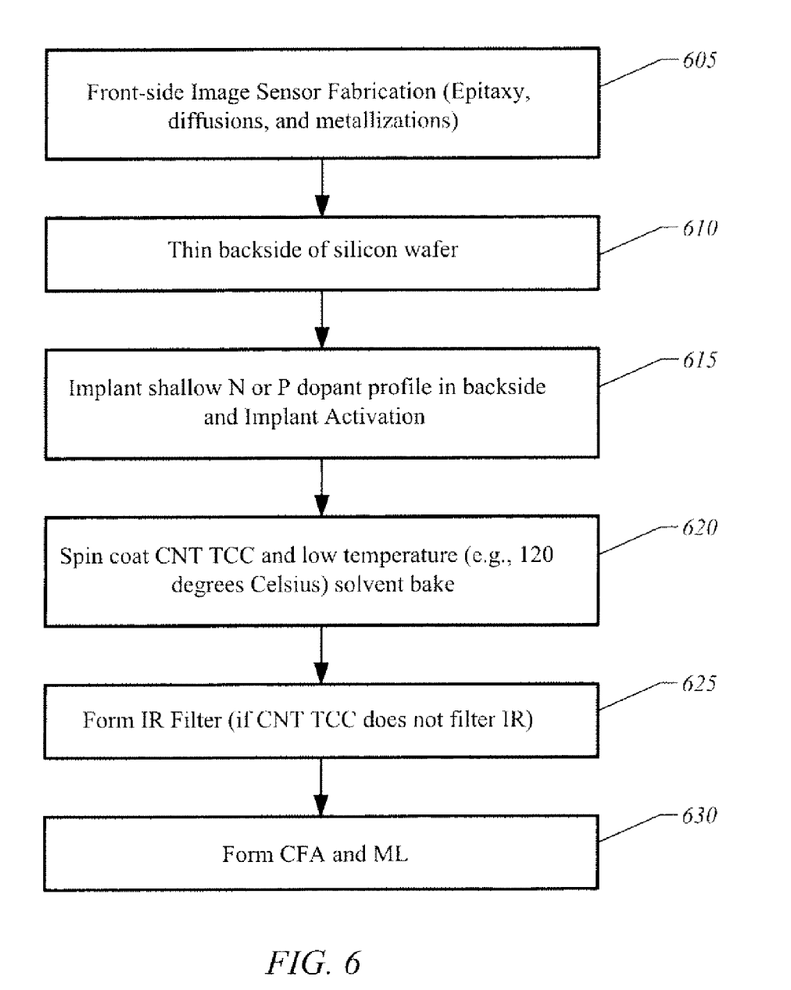
FIG. 6 is a flow chart of a fabrication method in accordance with one embodiment of the present invention.

FIG. 6 illustrates an exemplary fabrication process. A BSI image sensor fabrication process includes a front-side image sensor fabrication step 605, including epitaxy, diffusions, and metallization to form a pixel array. The backside of the silicon wafer is thinned in step 610. A shallow layer of N or P type dopants are implanted and activated in the backside in step 615. The CNT TCC is applied in step 620 using a spin coating process and a low temperature (e.g., 120 degrees Celsius) solvent bake. Note that the CNT coating itself can be performed by spinning, spraying, rolling, and dipping. An optional IR filter fabrication step 625 is included if the CNT TCC does not filter IR. If more than one CNT layer is used, additional CNT layers can be spun on followed by an additional solvent bake. A color filter array and micro-lens is then formed in step 630.

Figure 7:
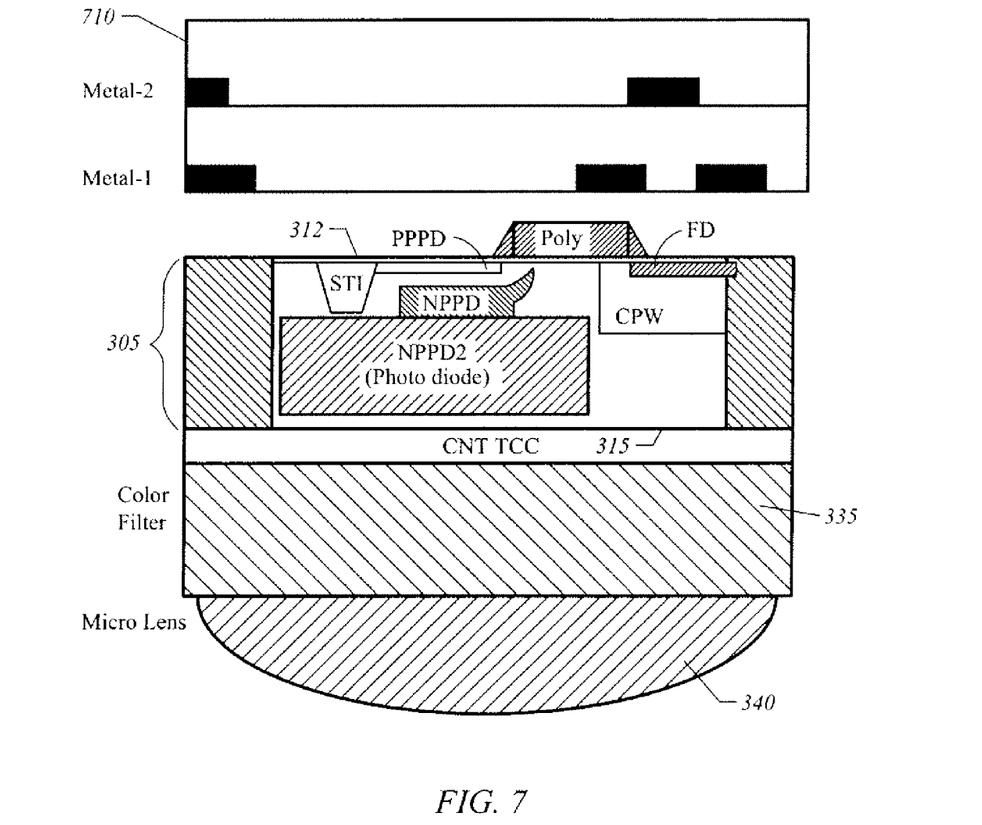
FIG. 7 illustrates in more detail an exemplary pixel portion of a BSI image sensor having a carbon nanotube conductive coating in accordance with one embodiment of the present invention.

FIG. 7 illustrates in more detail additional aspects of an exemplary structure. The CNT TCC may be any one of the previously described CNT TCCs 320, 420, or 520. An individual pixel 312 in wafer 305 includes a photodiode (NPPD2), Coplanar waveguides (CPW), partially pinned photodiode (PPPD), shallow trench isolation (STI), poly silicon conductors (Poly), and fully depleted (FD) region. An interposer 710 with metal interconnect layers 710 to form contacts to individual front side pixels is illustrated. Interposer 710 may be part of a rigid substrate. Alternatively, as previously described interposer 710 may form a flexible substrate and the CNT TCC may be have material characteristics selected so that it is flexible.

CNT coatings using a polyimide carrier may be patterned using, for example, dry etching techniques. It will thus be understood that in any of the previously described embodiments, such as CNT TCC 320, CNT TCC 420, and CNT TCC 520, that the CNT TCC may be removed and/or reduced in thickness in selected areas. For example, if desired CNT TCC 320, CNT TCC 420, and CNT TCC 520 may be removed in regions that do not correspond to the backside of pixels and/or electrode contact regions.

It will also be understood by one of ordinary skill in the art that attributes of the previously described CNT TCCs 320, 420, and 520 are not necessarily exclusive. For example, a flexible CNT TCC 420 may also filter infrared light.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:

1. A backside illuminated image sensor, comprising:
a substrate having a front surface and a back surface;
an array of light sensitive pixels formed in the front surface of the substrate, each pixel including at least one photodiode;
a carbon nanotube conductive coating disposed on the back surface of the substrate to apply a bias voltage to respective portions of the back surface of the substrate in electrical contact with each photodiode in the array of pixels;
the carbon nanotube conductive coating comprising carbon nanotubes embedded in a carrier with carbon nanotubes characteristics determining an optical absorption spectra, the carbon nanotube characteristics and a thickness of the carbon nanotube conductive coating being selected so that the carbon nanotube conductive coating is at least semi-transparent at each wavelength of visible light that the array of light sensitive pixels is designed to detect.

2. The backside illuminated image sensor of claim 1, wherein the carbon nanotube characteristics are selected to achieve a minimum pre-selected spectral response of the image sensor at each detected wavelength of visible light.

3. The backside illuminated image sensor of claim 1, wherein the carbon nanotube conductive coating is flexible.

4. The backside illuminated image sensor of claim 3, wherein the carrier is a polyimide.

5. The backside illuminated image sensor of claim 4, wherein the carbon nanotube conductive coating is a film formed by spin coating.

6. The backside illuminated image sensor of claim 1, wherein said carbon nanotube characteristics include a distribution of carbon nanotube diameters.

7. The backside illuminated image sensor of claim 6, wherein the carbon nanotube diameter is in the range of one to fifty nanometers.

8. The backside illuminated image sensor of claim 1, wherein the carbon nanotube conductive coating has a thickness less than ten microns.

9. The backside illuminated image sensor of claim 1, wherein the carbon nanotube conductive coating has an optical transparency of between 50%-99% for blue light and green light.

10. The backside illuminated image sensor of claim 1, wherein a purity of the carbon nanotubes affects the optical absorption spectra, the purity of the carbon nanotubes being selected to achieve an optical transparency of at least 50% for green and blue colors of light transmitted by the carbon nanotube conductive coating.

11. The backside illuminate image sensor of claim 1 wherein the carbon nanotube conductive coating filters infrared light.

12. A backside illuminated image sensor having a reduced part count, comprising:
a substrate having a front surface and a back surface;
an array of light sensitive pixels formed in the front surface of the substrate, each pixel including at least one photodiode;
a carbon nanotube conductive coating disposed over the back surface of the substrate to facilitate applying a uniform bias voltage to respective portions of the back surface of the substrate in electrical contact with each photodiode in the array of pixels;
the carbon nanotube conductive coating comprising carbon nanotubes embedded in a carrier with carbon nanotubes characteristics determining an optical absorption spectra, the carbon nanotube characteristics and a thickness of the carbon nanotube conductive coating being selected so that the carbon nanotube conductive coating is at least semi-transparent at each wavelength of visible light that the array of light sensitive pixels is designed to detect;
the carbon nanotube characteristics being further selected so that the carbon nanotube conductive coating acts as a wavelength selective optical filter for backside illumination of the array of pixels to filter at least one deleterious wavelength of light that degrades performance of the backside illuminated image sensor.

13. The backside illuminated image sensor of claim 12, wherein the carbon nanotube conductive coating filters infrared light.

14. The backside illuminated image sensor of claim 12, wherein said carbon nanotube characteristics include a distribution of carbon nanotube diameters.

15. The backside illuminated image sensor of claim 14, wherein the carbon nanotube diameter is in the range of one to fifty nanometers.

16. The backside illuminated image sensor of claim 12, wherein the carbon nanotube conductive coating has a thickness less than ten microns.

17. The backside illuminated image sensor of claim 12, wherein the carbon nanotube conductive coating has an optical transparency of at least 50% for blue and green color bands.

18. The backside illuminated image sensor of claim 12, further wherein said carbon nanotube characteristics include carbon nanotube types.

19. The backside illuminated image sensor of claim 12, wherein a purity of the carbon nanotubes affects the optical absorption spectra, the purity of the carbon nanotubes being selected so that the carbon nanotube conductive coating has an optical transparency of at least 50% for at least one color of visible light detected by the backside illuminated image sensor.

* * * * *